United States Patent
Yamazaki et al.

(10) Patent No.: US 7,808,161 B2
(45) Date of Patent: Oct. 5, 2010

(54) PIEZOELECTRIC CERAMIC COMPOSITION AND PIEZOELECTRIC DEVICE

(75) Inventors: Masato Yamazaki, Komaki (JP); Kohei Ito, Komaki (JP); Yasuhiro Fujii, Komaki (JP); Katsuya Yamagiwa, Komaki (JP); Takeshi Mitsuoka, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 198 days.

(21) Appl. No.: 12/055,079

(22) Filed: Mar. 25, 2008

(65) Prior Publication Data

US 2009/0289525 A1 Nov. 26, 2009

(51) Int. Cl.
*H01L 41/16* (2006.01)
(52) U.S. Cl. ........................ 310/358; 501/134
(58) Field of Classification Search .............. 501/134; 310/358
See application file for complete search history.

(56) References Cited

U.S. PATENT DOCUMENTS

| | | | | |
|---|---|---|---|---|
| 5,369,068 A | * | 11/1994 | Kaneko | 501/135 |
| 5,945,030 A | | 8/1999 | Kimura et al. | |
| 7,090,785 B2 | * | 8/2006 | Chiang et al. | 252/62.9 R |

FOREIGN PATENT DOCUMENTS

| | | | |
|---|---|---|---|
| JP | 50-67492 | | 6/1975 |
| JP | 11-29356 | | 2/1999 |
| JP | 2007-119269 | * | 5/2007 |

OTHER PUBLICATIONS

Seiji Ikegami, et al.; "Piezoelectricity in Ceramics of Ferroelectric Bismuth Compound with Layer Structure"; Japanese Journal of Applied Physics; vol. 13, No. 10, Oct. 1974; pp. 1572-1577.
Tadashi Takenaka, et al.; "Grain-Oriented and Mn-Doped (NaBi)(1-x)/2CaxBi4Ti4O15 Ceramics for Piezo- and Pyrosensor Materials"; Sensors and Materials; 1 (1988); pp. 035-046.
EMAS-6100; "Electrical Test Methods for Piezoelectric Ceramic Vibrators"; published by Standard of Electronic Materials Manufacturers Association of Japan (Mar. 1993), Abstract.

* cited by examiner

*Primary Examiner*—Walter Benson
*Assistant Examiner*—Bryan P Gordon
(74) *Attorney, Agent, or Firm*—Sughrue Mion, PLLC

(57) ABSTRACT

There is provided a piezoelectric ceramic composition that contains Na, Bi, Ti and Co wherein the composition ratio of Na, Bi, Ti and Co in terms of oxides thereof is in the following composition range (1):

$$a\text{Na}_2\text{O}\text{-}b\text{Bi}_2\text{O}_3\text{-}c\text{TiO}_2\text{-}d\text{CoO} \qquad (1)$$

where a, b, c and d are mole fractions; $0.03 \leq a \leq 0.042$; $0.330 \leq b \leq 0.370$; $0.580 \leq c \leq 0.620$; $0 < d \leq 0.017$; and $a+b+c+d=1$.

6 Claims, 3 Drawing Sheets

PIEZOELECTRIC CERAMIC COMPOSITION AND PIEZOELECTRIC DEVICE

BACKGROUND OF THE INVENTION

The present invention relates to a piezoelectric ceramic composition and a piezoelectric device and, more particularly, to a lead-free piezoelectric ceramic composition having a high heat resistance and a high piezoelectric distortion constant and a piezoelectric device using the piezoelectric ceramic composition.

Most of piezoelectric ceramic materials currently in practical use contain lead as typified by lead titanate (PT) and lead zirconate titanate (PZT). The lead-containing piezoelectric ceramic materials however raise a concern about the environmental effects of their lead components. Further, the lead-containing piezoelectric ceramic materials have a Curie point (Curie temperature) of about 200 to 500° C. and lose their piezoelectric properties at temperatures higher than or equal to the Curie point so that it is difficult to use the lead-containing piezoelectric ceramic materials for piezoelectric ceramic sensors whose operating temperatures are generally 500° C. or higher. There is a need for lead-free piezoelectric ceramic usable at 500° C. or higher with less environmental effects.

As such lead-free piezoelectric ceramic, a bismuth layer-structured ferroelectric material $Na_{0.5}Bi_{4.5}Ti_4O_{15}$ (NBT) is known. (See Patent Publications 1 and 2 and Non-Patent Publications 1 and 2.) The bismuth layer-structured ferroelectric material NBT is expected as lead-free piezoelectric ceramic usable under high-temperature conditions due to the fact that the Curie point of the bismuth layer-structured ferroelectric NBT is about 670° C. and higher than the Curie point of the PT and PZT materials.

[Patent Publication 1] Japanese Laid-Open Patent Publication No. S50-67492

[Patent Publication 2] Japanese Laid-Open Patent Publication No. H11-29356

[Non-Patent Publication 1] "Piezoelectricity in Ceramics of Ferroelectric Bismuth Compound with Layer Structure", S. Ikegami and I. Ueda, Japanese Journal of Applied Physics, 13 (1974), p. 1572-1577

[Non-Patent Publication 2] "Grain-Oriented and Mn-Doped $(NaBi)_{(1-x)/2}Ca_xBi_4Ti_4O_{15}$ Ceramics for Piezo- and Pyrosensor Materials", T. Takenaka and K. Sakata, Sensor and Materials, 1 (1988), p. 35-46

SUMMARY OF THE INVENTION

The bismuth layer-structured ferroelectric material $Na_{0.5}Bi_{4.5}Ti_4O_{15}$ (NBT) has a high Curie point and a high heat resistance but a low piezoelectric distortion constant and is thus difficult to use for sensors etc. Although it is known that the piezoelectric distortion constant of a material with grain anisotropy like the bismuth layer-structured ferroelectric NBT can be improved by orienting the material into a specific grain direction, such a grain orientation technique requires hot press treatment etc. so that the production process of the material becomes complicated to cause increase in production cost.

The present invention has been made to solve the above problems and to provide a piezoelectric ceramic composition with a high heat resistance and a high piezoelectric distortion constant and a piezoelectric device using the piezoelectric ceramic composition.

According to a first aspect of the present invention, there is provided a piezoelectric ceramic composition comprising Na, Bi, Ti and Co, wherein the composition ratio of Na, Bi, Ti and Co in terms of oxides thereof is in the following composition range (1):

$$a\text{Na}_2\text{O-}b\text{Bi}_2\text{O}_3\text{-}c\text{TiO}_2\text{-}d\text{CoO} \qquad (1)$$

where a, b, c and d are mole fractions; $0.03 \leq a \leq 0.042$; $0.330 \leq b \leq 0.370$; $0.580 \leq c \leq 0.620$; $0 < d \leq 0.017$; and $a+b+c+d=1$.

According to a second aspect of the present invention, there is provided a piezoelectric ceramic composition comprising Na, Bi, Ti and Co and containing a compound having a grain structure of $Na_{0.5}Bi_{4.5}Ti_4O_{15}$ as a main component, wherein the content of Co in terms of CoO is 0.70 mass % or less.

It is preferable that each of the above piezoelectric ceramic compositions has a main phase of bismuth layer-structured ferroelectric (BLSF). It is also preferable that each of the above piezoelectric ceramic compositions contains substantially no element of group 2 of the periodic table.

There is also provided according to the present invention a piezoelectric device with any of the above piezoelectric ceramic compositions and electrodes of different polarity.

DESCRIPTION OF THE EMBODIMENTS

Figure 1:
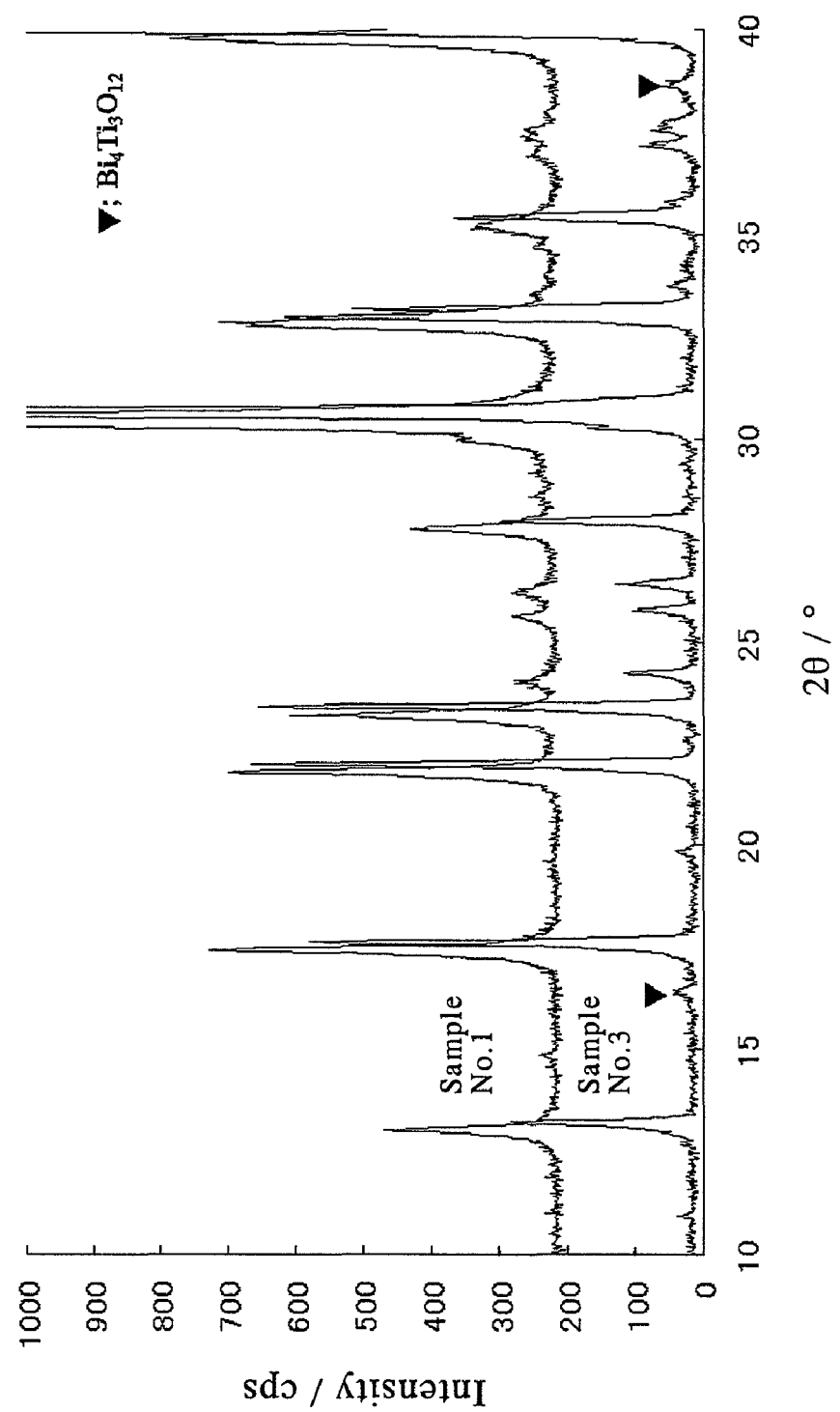
FIG. 1 is a chart diagram showing X-ray diffraction analysis results of piezoelectric ceramic compositions according to Example and Comparative Example.

The present invention is directed to a piezoelectric ceramic composition having a main phase of bismuth layer-structured ferroelectric $Na_{0.5}Bi_{4.5}Ti_4O_{15}$ (NBT) and being capable of attaining a high piezoelectric distortion constant by composition range control even with no grain orientation.

Namely, the piezoelectric ceramic composition of the present invention comprises Na, Bi, Ti and Co wherein the composition ratio of Na, Bi, Ti and Co in terms of oxide thereof is in the following composition range (1):

$$a\text{Na}_2\text{O-}b\text{Bi}_2\text{O}_3\text{-}c\text{TiO}_2\text{-}d\text{CoO} \qquad (1)$$

where a, b, c and d are mole fractions; $0.03 \leq a \leq 0.042$; $0.330 \leq b \leq 0.370$; $0.580 \leq c \leq 0.620$; $0 < d \leq 0.017$; and $a+b+c+d=1$.

Further, the piezoelectric ceramic composition of the present invention comprises Na, Bi, Ti and Co and contains a compound having a grain structure of $Na_{0.5}Bi_{4.5}Ti_4O_{15}$ as a main component wherein the content of Co in terms of CoO is 0.70 mass % or less. The CoO content is herein defined as the percentage of CoO in the piezoelectric ceramic composition.

In the present invention, the piezoelectric ceramic composition is produced by the addition of Co into the bismuth layer-structured ferroelectric NBT. This makes it possible not only to limit the growth of any impurity phase that can coexist with the bismuth layer-structured ferroelectric NBT and thereby increase the growth ratio of the bismuth layer-structured ferroelectric NBT during the production of the piezoelectric ceramic composition. This also makes it possible to generate a distortion in the grain structure of the bismuth layer-structured ferroelectric NBT and thereby increase the piezoelectric distortion constant of the piezoelectric ceramic composition.

In the case where the piezoelectric ceramic composition consists only of bismuth layer-structured ferroelectric NBT and contains no Co element, i.e., when the CoO mole fraction d of the above composition range (1) is 0 or when the content of Co in terms of CoO is 0 mass %, there grows an impurity phase of $Bi_4Ti_3O_{12}$ (BiT) together with the bismuth layer-structured ferroelectric NBT so that both of the growth ratio of the bismuth layer-structured ferroelectric NBT and the piezoelectric distortion constant of the piezoelectric ceramic composition decrease.

As the Co content of the bismuth layer-structured ferroelectric NBT increases, the growth ratio of the BiT impurity phase decreases and some amount of distortion occurs in the grain structure of the bismuth layer-structured ferroelectric NBT. When the CoO mole fraction d of the above composition range (1) exceeds 0.017 or when the content of Co in terms of CoO exceeds 0.70 mass %, the grain structure of the bismuth layer-structured ferroelectric NBT becomes unstable due to too large amount of grain structure distortion so that the piezoelectric distortion constant of the piezoelectric ceramic composition decreases.

Accordingly, the CoO mole fraction d of the above composition range (1) is controlled to within the range of $0<d\leq0.017$ or the content of Co in terms of CoO is controlled to within the range of 0 to 0.70 mass % in the present invention so as to limit the growth of the BiT impurity phase for a higher growth rate of the bismuth layer-structured ferroelectric NBT and to generate an appropriate amount of distortion in the grain structure of the bismuth layer-structured ferroelectric NBT for a higher piezoelectric distortion constant of the piezoelectric ceramic composition.

In order for the piezoelectric ceramic composition of the present invention to exhibit not only high heat resistance to withstand high-temperature conditions of about 500° C. but also excellent piezoelectric properties to attain a piezoelectric distortion constant (d33) of 20 (pC/N) or higher, it is desirable to control the mole fractions a to d of the above composition range (1) to within the ranges of $0.031\leq a\leq0.037$, $0.340\leq b\leq0.370$, $0.600\leq c\leq0.620$ and $0.0031<d\leq0.016$, respectively, and to control the content of Co in terms of CoO to within the range of 0.10 to 0.55 mass %. It is more desirable to control the mole fractions a to d of the above composition range (1) to within the ranges of $0.031\leq a\leq0.037$, $0.340\leq b\leq0.370$, $0.600\leq c\leq0.620$ and $0.0031<d\leq0.010$, respectively, and to control the content of Co in terms of CoO to within the range of 0.10 to 0.35 mass % in order for the piezoelectric ceramic composition of the present invention to exhibit not only high heat resistance to withstand high-temperature conditions of about 500° C. but also excellent piezoelectric properties to attain a piezoelectric distortion constant (d33) of 25 (pC/N) or higher.

Herein, the composition range of the piezoelectric ceramic composition can be determined by e.g. ICP (Inductively Coupled Plasma) emission spectroscopy, X-ray fluorescence spectroscopy or the like. In the X-ray fluorescence spectroscopy, the composition analysis of the piezoelectric ceramic composition is carried out by e.g. forming a sintered body of the piezoelectric ceramic composition, analyzing the sintered body with an X-ray fluorescence spectroscope and then determining a content ratio between metal constituent elements Na, Bi, Ti and Co of the piezoelectric ceramic composition to check whether the mole fractions of these metal constituent elements in terms of oxides thereof satisfy the composition formula (1) or whether the content of Co in terms of CoO ranges from not less than 0 mass % to not more than 0.70 mass %. In the ICP emission spectroscopy, the composition analysis of the piezoelectric ceramic composition is carried out by e.g. subjecting the piezoelectric ceramic composition to high-pressure sulfuric acid decomposition and analyzing the resulting decomposition product with an ICP emission spectroscope.

The piezoelectric ceramic composition of the present invention is substantially free of an element of group 2 of the periodic table (i.e. alkaline-earth metal elements). When the piezoelectric ceramic composition contains an element of group 2, it is likely that the degree of deterioration of the piezoelectric distortion constant of the piezoelectric ceramic composition under high-temperature conditions will become increased and that the Curie point of the piezoelectric ceramic composition will become lowered. In other words, the deterioration of the piezoelectric distortion constant of the piezoelectric ceramic composition under high-temperature conditions can be limited to a low degree by rendering the piezoelectric ceramic composition substantially free of the element of group 2. In the present specification, it means that the element of group 2 is undetectable by X-ray fluorescence analysis (XRF) when the piezoelectric ceramic composition is substantially free of the element of group 2.

Next, the production process of the piezoelectric ceramic composition of the present invention will be explained below. A sodium carbonate powder, a bismuth oxide powder, a titanium oxide powder and a cobalt oxide powder are first prepared as raw materials for metal constituent elements Na, Bi and Ti of the bismuth layer-structured ferroelectric NBT and additive element Co for improvement of the piezoelectric distortion constant. The raw powder materials are not necessarily prepared in the above forms and can alternatively be prepared in any forms such as oxides, carbonates and hydrogen carbonates.

The raw powder materials are weighed out in such a manner that the piezoelectric ceramic composition satisfies, as a final product, the above composition range (1), mixed together with a dispersant dispersion medium such as ethanol, and then, subjected to wet blending and pulverization by e.g. ball mill. The thus-obtained slurry is dried to yield a raw powder mixture.

The raw powder mixture is calcinated e.g. in the air at 600 to 1100° C. for 10 to 300 minutes. The calcinated powder mixture is blended with a binder such as polyvinyl alcohol or polyvinyl butyral and a dispersion medium such as alcohol or ether and subjected to wet pulverization by e.g. ball mill. The thus-obtained slurry is dried to yield a granulated powder material.

The granulated powder material is molded into a body of desired shape. There is no particular restriction on the shape of the molded body. The molded body can be of appropriately selected shape, e.g. disc shape, as needed. Further, the molding operation is preferably conducted by e.g. uniaxial molding at about 30 MPa, followed by cold isostatical press (CIP) at about 150 MPa. The resulting molded body is sintered e.g. at 1050 to 1250° C. for 1 to 10 hours.

Figure 3:
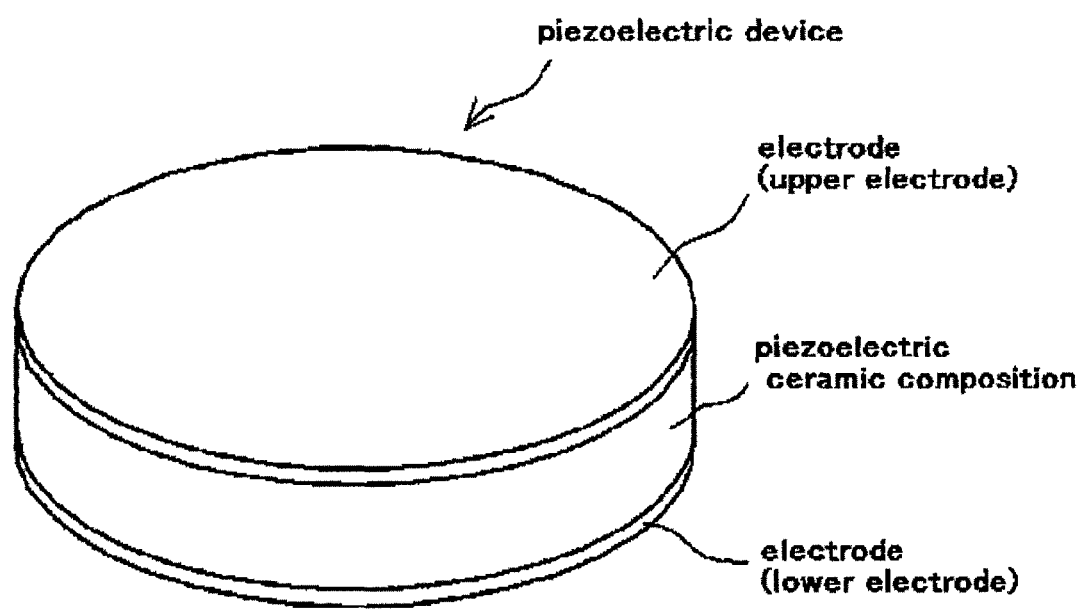
FIG. 3 is a piezoelectric device comprising the piezoelectric ceramic composition and a plurality of electrodes.

For example, when the sintered body is of disc shape, opposite main surfaces of the sintered body are subjected to surface grinding, coated with a conductive paste by screen printing etc. and subjected to baking as appropriate to form a plurality of electrodes of different polarity (positive and negative electrodes), as shown in FIG. 3.

The conductive paste may be that prepared from a conductive component, a glass frit and an organic medium. Examples of the conductive component are powders of noble metals such as silver, gold, palladium and platinum and alloys thereof and mixtures of two or more thereof. In addition to these noble metal components, there can be used powders of metals such as copper and nickel and alloys thereof and mixtures thereof. Examples of the glass frit are those containing $SiO_2$, $Al_2O_3$, ZnO and $TiO_2$. Examples of the organic medium are those commonly used for this kind of paste, such as alcohols and ethers.

The sintered body with the electrodes is polarized by the application of a direct-current voltage of about 3 to 12 kV/mm for 10 to 100 minutes in an insulating oil such as silicone oil at room temperature to about 200° C. With this, the piezoelectric ceramic composition is completed. The piezoelectric ceramic composition can be used with the electrodes applied to the composition surfaces or can be used after removal of the electrodes from the composition surfaces.

In this way, it is possible for the piezoelectric ceramic composition to attain an improved piezoelectric distortion coefficient even with no grain orientation, while securing high heat resistance, by the addition of a predetermined amount of Co element into the bismuth layer-structured ferroelectric $Na_{0.5}Bi_{4.5}Ti_4O_{15}$ (NBT) although the bismuth layer-structured ferroelectric $Na_{0.5}Bi_{4.5}Ti_4O_{15}$ (NBT) is known as one kind of lead-free piezoelectric ceramic material with high heat resistance and less environmental effect but difficult to use for sensors because of its low piezoelectric distortion constant.

The above-structured piezoelectric ceramic composition of high heat resistance and excellent piezoelectric properties is suitably usable for various piezoelectric devices such as piezoelectric vibrator, actuator, combustion pressure sensor, knocking sensor, ultrasonic motor and gyro sensor. In particular, the use of the piezoelectric ceramic composition of the present invention in the piezoelectric device allows long-term stable operation of the piezoelectric device with high sensitivity even under high-temperature conditions e.g. near automotive engine combustion chamber. The piezoelectric ceramic composition of the present invention is thus suitably usable for automotive parts typified by the combustion pressure sensor and knocking sensor.

The present invention will be described in more detail by reference to the following examples. It should be however noted that the following examples are only illustrative and not intended to limit the invention thereto.

Experiment 1

Using raw powders of sodium carbonate ($Na_2CO_3$, purity: 99.53%), bismuth oxide ($Bi_2O_3$, purity: 98.8%), titanium oxide ($TiO_2$, purity: 99.0%) and cobalt oxide (CoO, purity: 99.9%), Samples No. 1 to 12 were prepared in ratios (mole %) indicated in TABLE 1. In TABLE 1, Samples No. 2 to 11 were those within the scope of the present invention. On the other hand, Samples No. 1 and 12 were those out of the scope of the present invention due to the facts that Sample No. 1 contained no cobalt oxide and Sample No. 12 contained excessive cobalt oxide. The composition ratios of TABLE 1 are herein indicated in terms of the mixing ratios of the raw powders and slightly different from the composition ratios of the actually obtained piezoelectric ceramic compositions. Further, the raw powders were substantially free of impurity elements of group 2.

TABLE 1

| Sample No. | Mixing ratio [mol %] | | | |
| --- | --- | --- | --- | --- |
| | $Na_2CO_3$ | $Bi_2O_3$ | $TiO_2$ | CoO |
| 1* | 3.85 | 34.6 | 61.5 | 0.000 |
| 2 | 3.70 | 34.6 | 61.6 | 0.077 |
| 3 | 3.69 | 34.6 | 61.4 | 0.313 |
| 4 | 3.68 | 34.5 | 61.3 | 0.507 |
| 5 | 3.67 | 34.4 | 61.2 | 0.638 |
| 6 | 3.67 | 34.4 | 61.1 | 0.804 |
| 7 | 3.66 | 34.3 | 61.0 | 0.974 |
| 8 | 3.66 | 34.3 | 60.9 | 1.145 |
| 9 | 3.65 | 34.2 | 60.8 | 1.323 |
| 10 | 3.64 | 34.1 | 60.7 | 1.502 |
| 11 | 3.64 | 34.1 | 60.6 | 1.683 |
| 12* | 3.62 | 33.9 | 60.2 | 2.255 |

*Out of the scope of the present invention

The above raw powder mixture of each sample was blended with ethanol, followed by wet pulverization by ball mill for 15 hours. The resulting slurry was put in hot water and dried to yield a raw mixed powder. This pulverized raw material was calcinated at 800° C. for 120 minutes and then further blended with an organic binder and ethanol, followed by wet pulverization by ball mill. The thus-obtained slurry was put in hot water and dried to yield a granulated powder material.

The granulated powder material was molded into a disc shape of 20 mm in diameter and 3 mm in thickness by uniaxial molding at 30 MPa. The resulting disc-shaped molded body was subjected to cold isostatical press (CIP) at 150 MPa and sintered at 1150° C. for 120 minutes.

After grinding opposite main surfaces of the sintered body, a silver paste of a glass frit containing $SiO_2$, $Al_2O_3$, ZnO and $TiO_2$, a silver powder and butylcarbitol acetate as an organic medium was applied to the main surfaces of the sintered body and baked at 700° C. for 20 minutes to form silver electrodes on the disc-shaped ceramic body. The disc-shaped ceramic body was polarized by the application of a direct-current voltage of about 9 kV/mm for 30 minutes in an insulating oil at 150° C. With this, the piezoelectric ceramic composition (piezoelectric device) was completed.

The piezoelectric distortion constant (d33) of the piezoelectric device was measured. After heat treatment at 600° C. for 1 hour, the piezoelectric distortion constant (d33) of the piezoelectric device was again measured. The measurement of the piezoelectric distortion constant (d33) was conducted according to EMAS-6100 using an impedance analyzer (available as Model "4194A" from Hewlett-Packard Co.) under conditions that the piezoelectric device was placed still in a constant temperature bath of 20° C.

For confirmation of the composition range and grain phase of the piezoelectric ceramic composition in the piezoelectric device, the same sintered body as used for production of the piezoelectric ceramic composition was prepared and subjected to composition analysis by X-ray fluorescence spectroscopy as well as grain phase identification by X-ray diffraction. The X-ray fluorescence spectroscopic composition analysis was conducted using "ZSX100e" (trade name available from Rigaku Co.). The X-ray diffraction observation was conducted using "RU-200T" (trade name available from Rigaku Co.).

Figure 2:
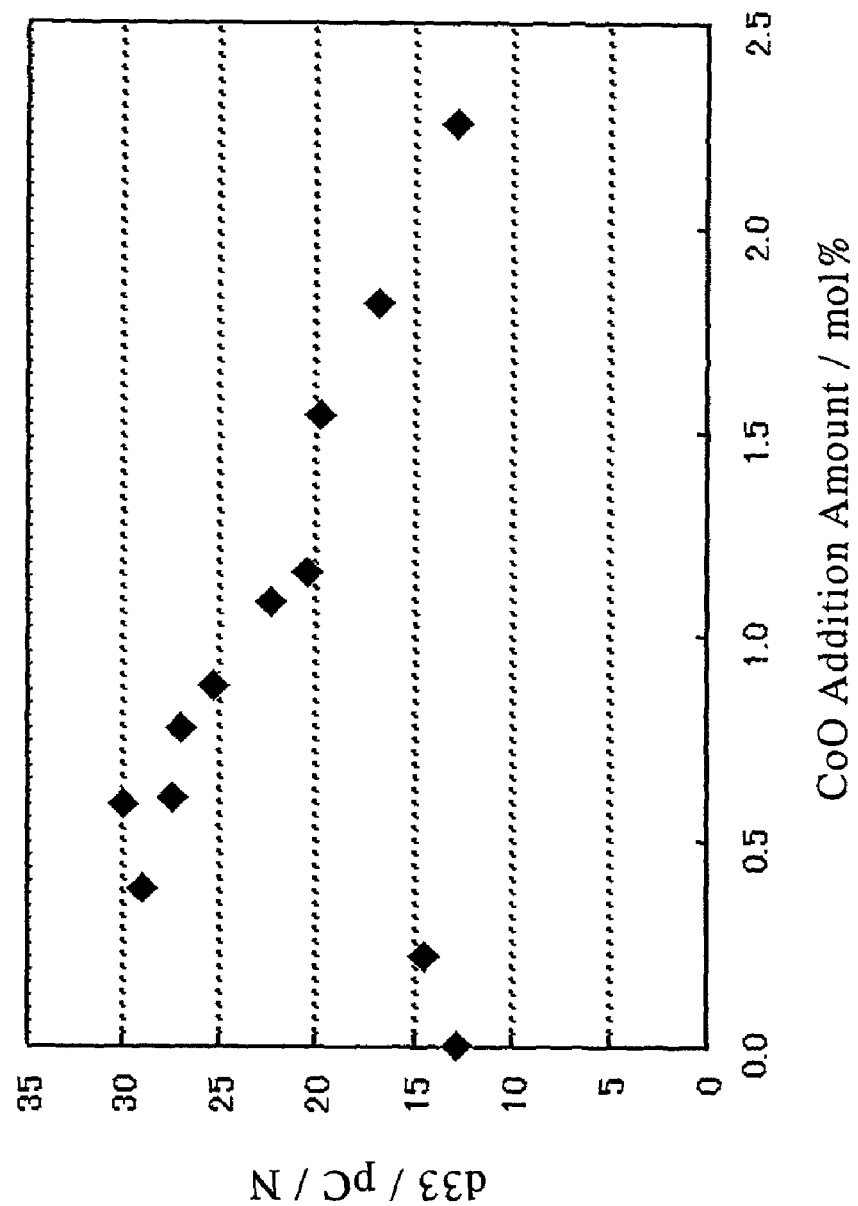
FIG. 2 is a graph showing a relationship between Co content and piezoelectric distortion constant of the piezoelectric ceramic composition.

FIG. 1 shows a chart diagram showing X-ray diffraction observation results of Samples No. 1 and 3. TABLES 2 and 3 show the X-ray fluorescence spectroscopic analysis results of the piezoelectric ceramic compositions and the piezoelectric distortion constant of the piezoelectric devices before the heat treatment. TABLE 4 shows the piezoelectric distortion constant of the piezoelectric devices of Samples No. 3 to 7 after the heat treatment. FIG. 2 shows a graph showing a relationship between CoO content (mol %) and d33 value (before the heat treatment) indicated in TABLE 2.

TABLE 2

| Sample No. | Elementary analysis result [mol %] | | | | d33 [pC/N] Before heat treatment |
|---|---|---|---|---|---|
| | $Na_2CO_3$ | $Bi_2O_3$ | $TiO_2$ | CoO | |
| 1* | 3.93 | 35.4 | 60.7 | 0.000 | 12.9 |
| 2 | 3.26 | 35.2 | 61.3 | 0.215 | 14.5 |
| 3 | 3.17 | 36.8 | 59.7 | 0.379 | 29.0 |
| 4 | 3.40 | 35.3 | 60.7 | 0.588 | 30.0 |
| 5 | 3.27 | 35.5 | 60.6 | 0.605 | 27.5 |
| 6 | 3.43 | 35.3 | 60.5 | 0.771 | 27.0 |
| 7 | 3.25 | 34.9 | 61.0 | 0.875 | 25.4 |
| 8 | 3.20 | 34.8 | 60.9 | 1.082 | 22.4 |
| 9 | 3.26 | 35.6 | 60.0 | 1.154 | 20.5 |
| 10 | 3.07 | 35.3 | 60.0 | 1.542 | 19.8 |
| 11 | 3.12 | 34.9 | 60.2 | 1.817 | 16.8 |
| 12* | 3.30 | 34.6 | 59.8 | 2.294 | 12.9 |

*Out of the scope of the present invention

TABLE 3

| Sample No. | Main component | CoO [mass %] | d33 [pC/N] Before heat treatment |
|---|---|---|---|
| 1* | NBT | 0.00 | 12.9 |
| 2 | NBT | 0.03 | 14.5 |
| 3 | NBT | 0.11 | 29.0 |
| 4 | NBT | 0.18 | 30.0 |
| 5 | NBT | 0.23 | 27.5 |
| 6 | NBT | 0.28 | 27.0 |
| 7 | NBT | 0.34 | 25.4 |
| 8 | NBT | 0.41 | 22.4 |
| 9 | NBT | 0.47 | 20.5 |
| 10 | NBT | 0.53 | 19.8 |
| 11 | NBT | 0.60 | 16.8 |
| 12* | NBT | 0.80 | 12.9 |

*Out of the scope of the present invention

TABLE 4

| | d33 [pC/N] | |
|---|---|---|
| Sample No. | Before heat treatment | After heat treatment |
| 3 | 29.0 | 26.5 |
| 4 | 30.0 | 27.5 |
| 5 | 27.5 | 25.1 |
| 6 | 27.0 | 24.1 |
| 7 | 25.4 | 22.1 |

As is seen from the X-ray diffraction observation results of FIG. 1, each of Samples No. 1 and 3 had a bismuth layer-structured ferroelectric NBT. It has been confirmed by X-ray diffraction observation that the other samples also had a bismuth layer-structured ferroelectric NBT. It has been further confirmed by additional X-ray diffraction observation that each of the piezoelectric ceramic compositions of Samples No. 1 to 12 had no grain orientation.

In the piezoelectric ceramic composition of Sample No. 1 with no Co element, however, there grew an impurity phase of BiT as is seen from the X-ray diffraction observation results of FIG. 1. The piezoelectric ceramic composition of Sample No. 1 also had a piezoelectric distortion constant of lower than 13 (pC/N).

In the piezoelectric ceramic composition of Sample No. 12 with excessive Co element, the growth of a BiT impurity phase was limited as is seen from the X-ray diffraction observation results. The piezoelectric ceramic composition of Sample No. 12 however had a piezoelectric distortion constant of lower than 13 (pC/N) due to a large degree of distortion in the grain structure of the bismuth layer-structured ferroelectric NBT.

By contrast, the growth of a BiT impurity phase was limited in each of the piezoelectric ceramic compositions of Samples No. 2 to 11 as is seen from the X-ray diffraction observation results. Further, the piezoelectric ceramic compositions of Samples No. 2 to 11 had a piezoelectric distortion constant of over 13 (pC/N). As is also apparent from FIG. 2, Samples No. 3 to 7 with the molar fraction of Co in terms of CoO ranging from 0.0031 to 0.010 had a particularly higher piezoelectric distortion constant of over 25 (pC/N). In these samples, the content of Co in terms of CoO, i.e., the CoO content in units of mass % were within the range of 0.10 to 0.35 mass %.

As is seen from TABLE 4, each of Samples No. 2 to 11 had a relatively small change between the piezoelectric distortion constant values before and after the heat treatment. Among others, Samples No. 3 to 5 maintained a high piezoelectric distortion constant of over 25 (pC/N) even after the heat treatment and had particularly high heat resistance.

It has been thus verified that the piezoelectric ceramic composition can attain both of high heat resistance and high piezoelectric distortion constant by the addition of a predetermined amount of Co as an essential element into the bismuth layer-structured ferroelectric NBT.

Experiment 2

The same piezoelectric ceramic composition (piezoelectric device) as Sample No. 4 of Experiment 1 and piezoelectric ceramic compositions (as Comparative Examples) with group 2 elements Ba and Sr added to the piezoelectric ceramic composition (piezoelectric device) of Sample No. 4 were tested for Curie Temperature (Tc), initial piezoelectric distortion constant (d33) (before heat treatment) and piezoelectric distortion constant (d33) after heat treatment at 600° C. for 1 hour. For the piezoelectric ceramic composition of Sample No. 4, the same raw powders as in Experiment 1 were used. Raw powders of Samples No. 13 and 14 were prepared based on those for the piezoelectric ceramic composition of Sample No. 4 but in such a manner as to, when the main component NBT of the piezoelectric ceramic composition of Sample No. 4 was expressed as $(Na_{0.5}Bi_{0.5})Bi_4Ti_4O_{15}$, replace $(Na_{0.5}Bi_{0.5})$ with 25 mol % Ba and 25 mol % Sr, respectively. Using the prepared raw powder materials, the piezoelectric devices were produced in the same manner as in Experiment 1.

The Curie temperature Tc of the piezoelectric device (each sample) was measured using an impedance analyzer (available as Model "4194A" from Hewlett-Packard Co.) and an electric furnace. The initial piezoelectric distortion constant (d33) of the piezoelectric device (before heat treatment) and the piezoelectric distortion constant (d33) of the piezoelectric device after heat treatment at 600° C. for 1 hour were measured in the same manner as in Experiment 1. The measurement results are indicated in TABLE 5. Further, the piezoelectric ceramic compositions of Samples No. 13 and 14 were analyzed by X-ray fluorescence spectroscopy and found to contain Ba and Sr components, respectively.

TABLE 5

| Sample No. | Group 2 element | Tc [° C.] | d33 [pC/N] before heat treatment | d33 [pC/N] after heat treatment |
|---|---|---|---|---|
| 4 | no addition | 680 | 30.0 | 27.5 |
| 13* | Ba | 580 | 18.3 | 0 |
| 14* | Sr | 570 | 24.0 | 0 |

*Out of the scope of the present invention

As is seen from TABLE 5, Samples No. 13 and 14 with group 2 elements Ba and Sr (Comparative Examples) had a low Tc point of below 600° C. Further, the piezoelectric distortion constant (d33) of Samples No. 13 and 14 deteriorated significantly during the heat treatment although the piezoelectric distortion constant (d33) of Sample No. 4 deteriorated slightly during the heat treatment within the range of no problem in practical use. It has been thus verified that the deterioration of the piezoelectric distortion constant of the piezoelectric ceramic composition can be limited to a low degree by the addition of Co as an essential element, but substantially no element of group 2, into the bismuth layer-structured ferroelectric NBT.

Although the present invention has been described with reference to the above specific embodiments, the invention is not limited to these exemplary embodiments. Various modification and variation of the embodiments described above will occur to those skilled in the art in light of the above teachings. For example, the piezoelectric ceramic composition of the present invention may contain a slight amount of impurity or impurities as long as the impurity or impurities do not cause deterioration in heat resistance and piezoelectric distortion constant. The piezoelectric device is not limited that produced by applying different polarity electrodes to opposite surfaces of the disc-shaped piezoelectric ceramic composition (sintered body). A square-shaped piezoelectric ceramic composition (sintered body) with different polarity electrodes may be used as the piezoelectric device. A plurality of different polarity electrodes may be applied to one surface of the piezoelectric ceramic composition.

What is claimed is:

1. A piezoelectric ceramic composition comprising Na, Bi, Ti and Co wherein the composition ratio of said Na, Bi, Ti and Co in terms of oxides thereof is in the following composition range (1):

$$aNa_2O\text{-}bBi_2O_3\text{-}cTiO_2\text{-}dCoO \quad (1)$$

where a, b, c and d are mole fractions; $0.03 \leqq a \leqq 0.042$; $0.330 \leqq b \leqq 0.370$; $0.580 \leqq c \leqq 0.620$; $0 < d \leqq 0.017$; and $a+b+c+d=1$; and wherein the composition has a main phase of bismuth layer-structured ferroelectric (BLSF).

2. A piezoelectric ceramic composition according to claim 1, wherein the composition is substantially free of an element of group 2 of the periodic table.

3. A piezoelectric device, comprising:
a piezoelectric ceramic composition according to claim 1; and
a plurality of electrodes of different polarity.

4. A piezoelectric ceramic composition comprising NA, Bi, Ti and Co and containing a compound having a grain structure $Na_{0.5}Bi_{4.5}Ti_4O_{15}$ as a main component, wherein the content of said Co in terms of CoO is greater than 0 mass % and equal to 0.70 mass % or less; and wherein the composition has a main phase of bismuth layer-structured ferroelectric (BLSF).

5. A piezoelectric ceramic composition according to claim 4, wherein the composition is substantially free of an element of group 2 of the periodic table.

6. A piezoelectric device comprising:
a piezoelectric ceramic composition according to claim 4; and
a plurality of electrodes of different polarity.

* * * * *